(12) United States Patent
Goto et al.

(10) Patent No.: US 12,087,711 B2
(45) Date of Patent: Sep. 10, 2024

(54) SEMICONDUCTOR DEVICE

(71) Applicant: Murata Manufacturing Co., Ltd., Kyoto-fu (JP)

(72) Inventors: Satoshi Goto, Nagaokakyo (JP); Shunji Yoshimi, Nagaokakyo (JP); Mikiko Fukasawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 515 days.

(21) Appl. No.: 17/548,718

(22) Filed: Dec. 13, 2021

(65) Prior Publication Data
US 2022/0199558 A1 Jun. 23, 2022

(30) Foreign Application Priority Data

Dec. 18, 2020 (JP) ................................. 2020-210057

(51) Int. Cl.
| | |
|---|---|
| *H03F 3/21* | (2006.01) |
| *H01L 23/66* | (2006.01) |
| *H01L 25/065* | (2023.01) |
| *H03F 1/56* | (2006.01) |
| *H03F 3/19* | (2006.01) |

(52) U.S. Cl.
CPC .......... *H01L 23/66* (2013.01); *H01L 25/0657* (2013.01); *H03F 3/21* (2013.01); *H01L 2223/6655* (2013.01); *H01L 2225/06517* (2013.01); *H03F 1/56* (2013.01); *H03F 2200/222* (2013.01); *H03F 2200/387* (2013.01); *H03F 2200/451* (2013.01)

(58) Field of Classification Search
CPC ................. H01L 23/66; H01L 25/0657; H01L 2223/6655; H01L 2225/06517; H01L 24/13; H01L 27/0658; H01L 2224/0401; H01L 2224/13082; H01L 2224/131; H01L 29/66242; H01L 2223/6644; H01L 2223/6683; H01L 2224/05567; H01L 2224/13144; H01L 2224/13147; H01L 2224/94; H01L 29/7371; H01L 27/0248; H01L 23/528; H03F 3/21; H03F 1/56; H03F 2200/222; H03F 2200/387; H03F 2200/451; H03F 3/195; H03F 3/245; H03F 3/213; H03F 2200/294
USPC ......................................... 330/302, 250, 307
See application file for complete search history.

(56) References Cited

U.S. PATENT DOCUMENTS

| | | | |
|---|---|---|---|
| 10,643,962 B1 * | 5/2020 | Ichitsubo | .................. H03F 3/72 |
| 11,575,351 B2 * | 2/2023 | Ranta | ...................... H03F 3/213 |
| 2015/0303971 A1 | 10/2015 | Reisner et al. | |

* cited by examiner

Primary Examiner — Hieu P Nguyen
(74) Attorney, Agent, or Firm — Studebaker & Brackett PC

(57) ABSTRACT

In a semiconductor device, when a first surface of a first member is viewed in plan, at least one switch circuit including a switch is disposed within the first surface. A second member is joined to the first surface of the first member in surface contact with the first surface. The second member includes a plurality of transistors that are made of a compound semiconductor and form a radio-frequency amplifier circuit. A first conductive protrusion protrudes from the second member on an opposite side to the first member. The first member includes a circuit element disposed between the radio-frequency amplifier circuit and the at least one switch circuit in a plan view, the circuit element not forming the switch circuit.

4 Claims, 12 Drawing Sheets ial communications are installed in electronic devices for communications such as mobile communications and satellite communications. An RF front-end module includes, for example, a monolithic microwave integrated circuit (MMIC) with a function of amplifying radio-frequency signals, a control integrated circuit (IC) for controlling a radio-frequency amplifier circuit, a switch IC, and a duplexer.
SEMICONDUCTOR DEVICE

CROSS-REFERENCE TO RELATED APPLICATION

This application claims benefit of priority to Japanese Patent Application No. 2020-210057, filed Dec. 18, 2020, the entire content of which is incorporated herein by reference.

BACKGROUND

Technical Field

The present disclosure relates to a semiconductor device.

Background Art

Radio-frequency (RF) front-end modules with integrated functions of transmitting and receiving radio-frequency signals are installed in electronic devices for communications such as mobile communications and satellite communications. An RF front-end module includes, for example, a monolithic microwave integrated circuit (MMIC) with a function of amplifying radio-frequency signals, a control integrated circuit (IC) for controlling a radio-frequency amplifier circuit, a switch IC, and a duplexer.

U.S. Patent Application Publication No. 2015/0303971 discloses a radio-frequency module that is miniaturized by stacking a control IC on an MMIC. The radio-frequency module disclosed in U.S. Patent Application Publication No. 2015/0303971 includes the MMIC mounted on a module substrate and the control IC stacked on the MMIC. Electrodes of the MMIC, electrodes of the control IC, and electrodes on the module substrate are electrically connected to each other by wire bonding.

SUMMARY

For example, a heterojunction bipolar transistor (HBT) is utilized in a radio-frequency amplifier circuit. During operation of an HBT, the HBT generates heat because collector dissipation occurs. A temperature rise of the HBT caused by heat generation in turn increases a collector current. When conditions for this positive feedback are satisfied, thermal runaway occurs in the HBT. To avoid the thermal runaway in the HBT, an upper limit of output power of the HBT is restricted.

To increase a power output of the radio-frequency amplifier circuit, it is desirable to improve the characteristics of heat dissipation from a semiconductor device including an HBT and so on. The radio-frequency module disclosed in U.S. Patent Application Publication No. 2015/0303971 is difficult to satisfy a recent demand for radio-frequency amplifier circuits with high power outputs.

Accordingly, the present disclosure provides a semiconductor device that can improve the characteristics of heat dissipation.

According to one aspect of the present disclosure, a semiconductor device includes a first member having a first surface and including at least one switch circuit that includes a switch and is disposed within the first surface when the first surface is viewed in plan, and a second member joined to the first surface of the first member in surface contact with the first surface. The second member includes a plurality of transistors that are made of a compound semiconductor and form a radio-frequency amplifier circuit. The semiconductor device further includes a first conductive protrusion protruding from the second member on an opposite side to the first member. The first member includes a circuit element disposed between the radio-frequency amplifier circuit and the at least one switch circuit in a plan view, the circuit element not forming the at least one switch circuit.

There are formed two heat transfer paths, namely a heat transfer path extending from the transistors to the first member after passing through a joining interface between the first member and the second member and a transfer path extending from the second member, through the first conductive protrusion, to a module substrate on which the semiconductor device is mounted. As a result, the characteristics of heat dissipation from the transistors can be improved. Furthermore, between the radio-frequency amplifier circuit and the at least one switch circuit, the circuit element not forming the switch circuit is disposed. Hence isolation between the radio-frequency amplifier circuit and the switch circuit can be increased.

DETAILED DESCRIPTION

First Embodiment

A semiconductor device according to a first embodiment will be described below with reference to FIGS. 1 to 8D. The semiconductor device according to the first embodiment described below is a radio-frequency power amplifier.

Figure 1:
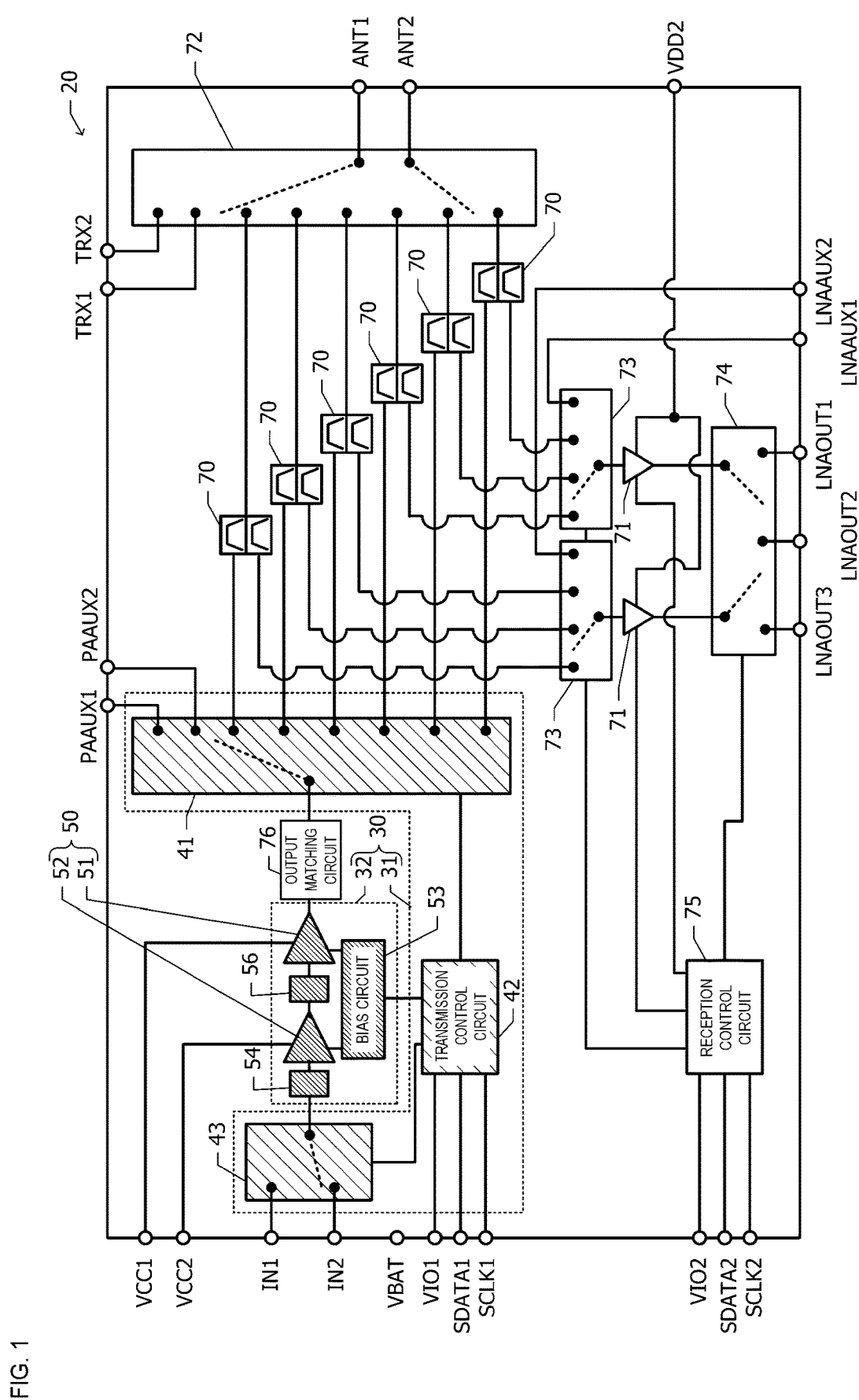
FIG. 1 is a block diagram of a radio-frequency module including a semiconductor device according to a first embodiment.

FIG. 1 is a block diagram of a radio-frequency module 20 including the semiconductor device 30 according to the first embodiment. The radio-frequency module 20 includes the semiconductor device 30 according to the first embodiment, an output matching circuit 76, a plurality of duplexers 70, an antenna switch 72, two band selection switches 73 for reception, two low-noise amplifiers 71, an output terminal selection switch 74 for reception, and a reception control circuit 75. Those circuit components are flip-chip mounted on a module substrate. The radio-frequency module 20 has a function of transmitting and receiving signals in accordance with a frequency division duplex (FDD) system.

The semiconductor device 30 includes a first member 31 and a second member 32 joined to the first member 31. For example, the first member 31 is made of an elemental semiconductor, and the second member 32 is made of a compound semiconductor. An input switch circuit 43, a transmission control circuit 42, and an output switch circuit 41 are formed in the first member 31. A two-stage radio-frequency amplifier circuit 50 made up of a power-stage amplifier circuit 51 and a driver-stage amplifier circuit 52, a bias circuit 53, an input matching circuit 54, and an interstage matching circuit 56 are formed in the second member 32. The driver-stage amplifier circuit 52 is a first-stage amplifier circuit, and the power-stage amplifier circuit 51 is a final-stage amplifier circuit. In FIG. 1, circuits disposed in the first member 31 are denoted by relatively light hatching, and circuits disposed in the second member 32 are denoted by relatively dark hatching.

The bias circuit 53 supplies bias currents to the power-stage amplifier circuit 51 and the driver-stage amplifier circuit 52 in accordance with control signals from the transmission control circuit 42.

Two input contacts of the input switch circuit 43 are connected in one-to-one relation to radio-frequency signal input terminals IN1 and IN2 disposed on or in the module substrate. Radio-frequency signals are input through the two radio-frequency signal input terminals IN1 and IN2. The input switch circuit 43 selects one of the two input contacts and causes the radio-frequency signal input to the selected contact to be input to the driver-stage amplifier circuit 52 through the input matching circuit 54.

The radio-frequency signal amplified by the driver-stage amplifier circuit 52 is input to the power-stage amplifier circuit 51 through the interstage matching circuit 56. The radio-frequency signal amplified by the power-stage amplifier circuit 51 is input to one input contact of the output switch circuit 41 after passing through the output matching circuit 76. The output switch circuit 41 selects one of a plurality of output contacts and causes the radio-frequency signal amplified by the radio-frequency amplifier circuit 50 to be output from the selected output contact.

Two of the output contacts of the output switch circuit 41 are connected in one-to-one relation to auxiliary output terminals PAAUX1 and PAAUX2 disposed on or in the module substrate. The other six output contacts are connected to input ports for transmission of the duplexers 70 that are prepared individually for each of bands. The output switch circuit 41 has a function of selecting one from the duplexers 70 prepared individually for each of bands.

The antenna switch 72 includes a plurality of circuit-side contacts and two antenna-side contacts. Two of the circuit-side contacts of the antenna switch 72 are connected to transmitted-signal input terminals TRX1 and TRX2 in one-to-one relation. The other six circuit-side contacts are connected to input-output common ports of the duplexers 70 in one-to-one relation. The two antenna-side contacts are connected to antenna terminals ANT1 and ANT2 in one-to-one relation. An antenna is connected to each of the antenna terminals ANT1 and ANT2.

The antenna switch 72 connects the two antenna-side contacts to two selected from the circuit-side contacts in one-to-one relation. When a single band is used for communication, the antenna switch 72 connects one circuit-side contact and one antenna-side contact. A radio-frequency signal amplified by the radio-frequency amplifier circuit 50 and passed through one duplexer 70 for the corresponding band is transmitted from the antenna connected to the selected antenna-side contact.

The two band selection switches 73 for reception each include four input contacts and one output contact. Three of the four input contacts in each of the two band selection switches 73 are connected to output ports for reception of the duplexers 70 in one-to-one relation. The remaining one input contact in each of the two band selection switches 73 is connected to an auxiliary input terminal LNAAUX1 or LNAAUX2.

The output contacts of the two band selection switches 73 for reception are connected to the two low-noise amplifiers 71 in one-to-one relation. The two band selection switches 73 for reception each cause a received signal after passing through the duplexer 70 to be input to the corresponding low-noise amplifier 71.

Two circuit-side contacts of the output terminal selection switch 74 are connected to output ports of the two low-noise amplifiers 71 in one-to-one relation. Three terminal-side contacts of the output terminal selection switch 74 are connected to received-signal output terminals LNAOUT1, LNAOUT2, and LNAOUT3 in one-to-one relation. A received signal amplified by the low-noise amplifier 71 is output from the received-signal output terminal selected by the output terminal selection switch 74.

Supply voltages are applied to the power-stage amplifier circuit 51 and the driver-stage amplifier circuit 52 from power supply terminals VCC1 and VCC2, respectively, disposed on or in the module substrate.

The transmission control circuit 42 is connected to a power supply terminal VIO1, a control signal terminal SDATA1, and a clock terminal SCLK1. The transmission control circuit 42 controls the bias circuit 53, the input switch circuit 43, and the output switch circuit 41 in accordance with control signals applied to the control signal terminal SDATA1.

The reception control circuit 75 is connected to a power supply terminal VIO2, a control signal terminal SDATA2, and a clock terminal SCLK2. The reception control circuit 75 controls the low-noise amplifiers 71, the band selection switch 73 for reception, and the output terminal selection switch 74 in accordance with control signals applied to the control signal terminal SDATA2.

A power supply terminal VBAT and a drain voltage terminal VDD2 are further disposed on or in the module substrate. Supply power is applied from the power supply terminal VBAT to the bias circuit 53 and the transmission control circuit 42. A supply voltage is applied from the drain voltage terminal VDD2 to each of the low-noise amplifiers 71.

Figure 2:
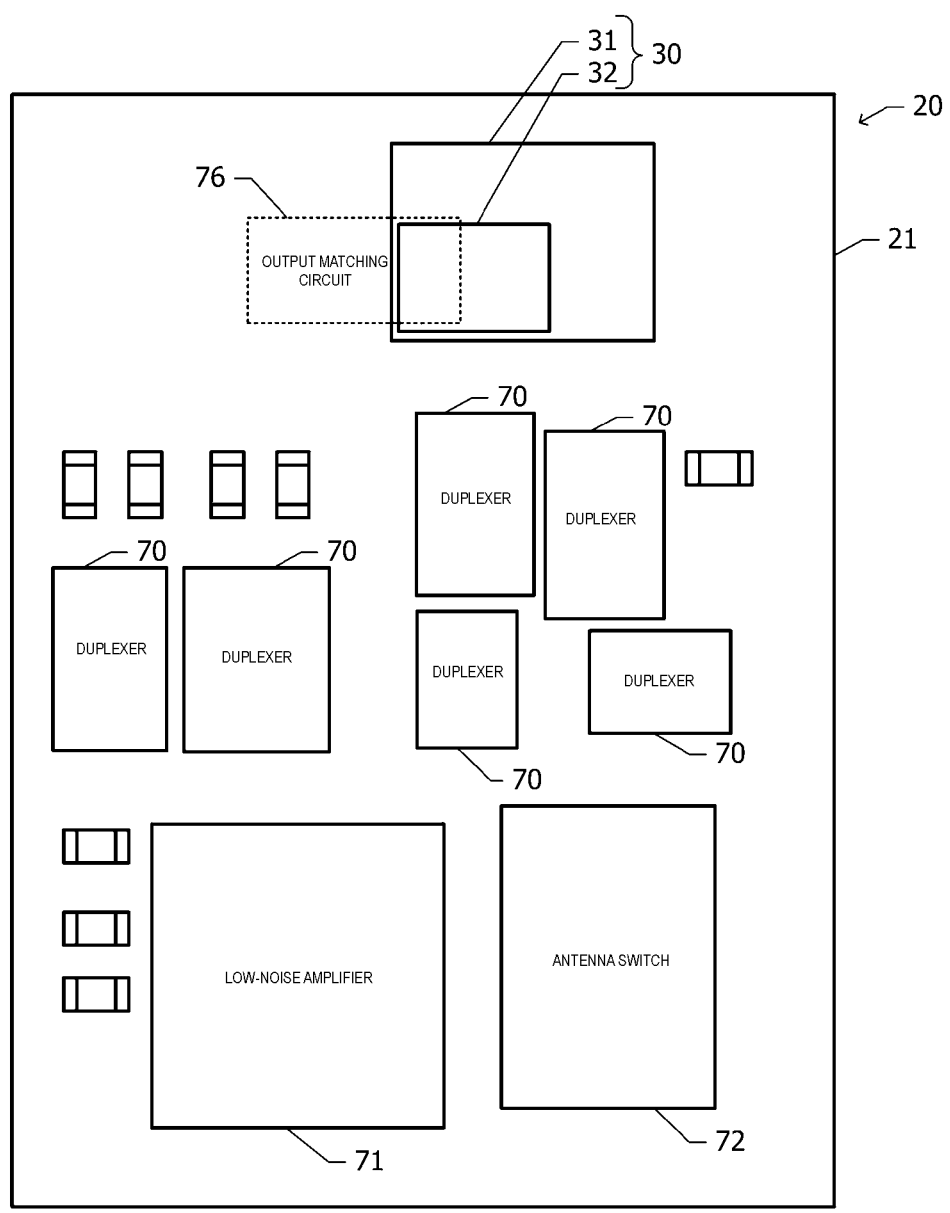
FIG. 2 illustrates a positional relation in a plan view among circuit components of the radio-frequency module including the semiconductor device according to the first embodiment.

FIG. 2 illustrates a positional relation in a plan view among circuit components of the radio-frequency module 20 including the semiconductor device according to the first embodiment. The semiconductor device 30, the duplexers 70, the low-noise amplifiers 71, the antenna switch 72, and a plurality of other surface-mounted passive components are mounted on or in the module substrate 21. The first member 31 of the semiconductor device 30 has a larger size than the second member 32 and encompasses the second member 32 in a plan view.

The output matching circuit 76 is constituted by passive elements, such as inductors, disposed in the module substrate, capacitors surface-mounted on the module substrate, and so on. The inductors forming the output matching circuit 76 are disposed at positions overlapping the semiconductor device 30 in a plan view. The output matching circuit 76 may be constituted by integrated passive components.

Figure 3:
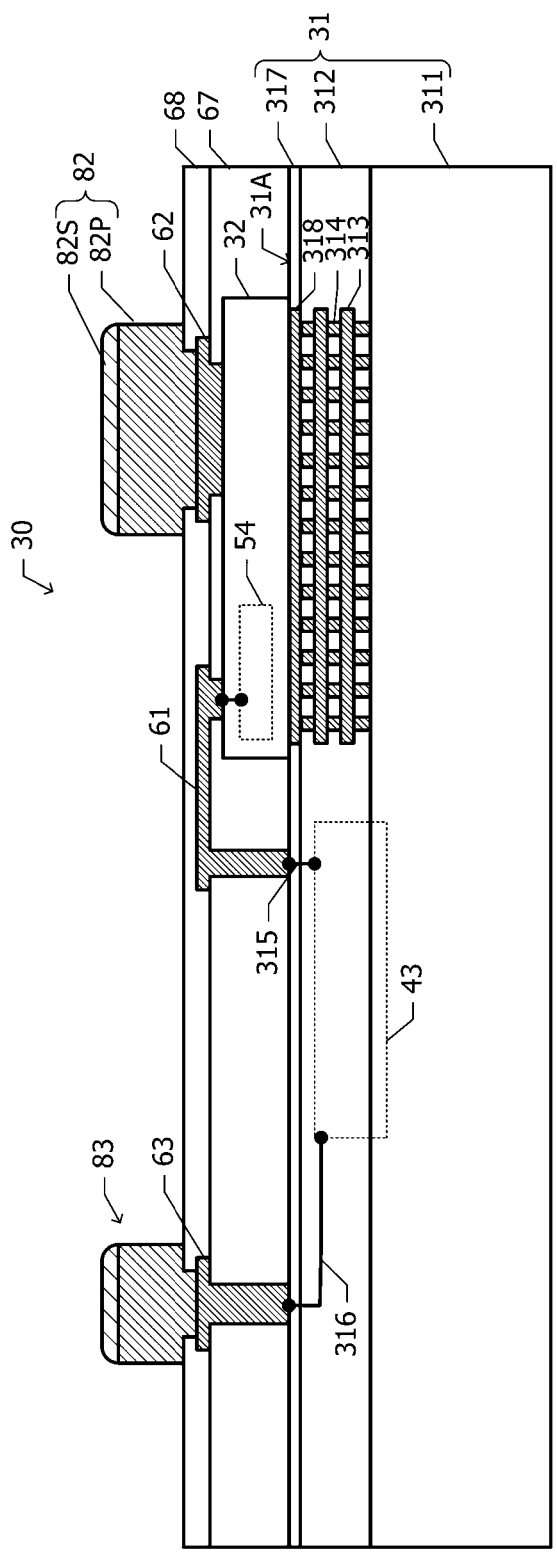
FIG. 3 is a schematic sectional view of the semiconductor device according to the first embodiment.

FIG. 3 is a schematic sectional view of the semiconductor device 30 according to the first embodiment. The first member 31 includes a substrate 311, a multilayer wiring structure 312 disposed on the substrate 311, and a first-member protection film 317 covering a surface of the multilayer wiring structure 312. The substrate 311 includes a semiconductor portion made of an elemental semiconductor. For example, a silicon substrate or a silicon-on-insulator (SOI) substrate is used as the substrate 311. The output switch circuit 41 (FIG. 1), the transmission control circuit 42 (FIG. 1), and the input switch circuit 43 (FIG. 1) are constituted by semiconductor elements formed in a surface layer portion of the substrate 311 and by wirings in the multilayer wiring structure 312. In FIG. 3, a region where the input switch circuit 43 is formed is denoted by a surrounding dashed line. An outermost surface of the first member 31 is called here a first surface 31A. An opening is formed in part of the first-member protection film 317, and a metal film 318 is filled in the opening. Upper surfaces of the first-member protection film 317 and the metal film 318 correspond to the first surface 31A.

The second member 32 is joined to the first surface 31A of the first member 31 in surface-contact with the first surface 31A. Furthermore, at least part of the second member 32 overlaps at least part of the metal film 318 in a plan view, and the second member 32 is in surface-contact with the metal film 318. The power-stage amplifier circuit 51, the driver-stage amplifier circuit 52, the bias circuit 53, the input matching circuit 54, and the interstage matching circuit 56, all illustrated in FIG. 1, are formed in the second member 32. In FIG. 3, a region where the input matching circuit 54 is disposed is denoted by a surrounding dashed line.

An interlayer insulating film 67 is disposed on the first surface 31A to cover the second member 32. A plurality of openings are formed in the interlayer insulating film 67 at predetermined positions. Pads 62 and 63 and a wiring 61 are disposed on the interlayer insulating film 67. A wiring layer in which the pads 62 and 63 and the wiring 61 are disposed is called a redistribution layer in some cases. The wiring 61 in the redistribution layer is called a rewiring line or a redistribution line in some cases.

The wiring 61 passes through the opening formed in the interlayer insulating film 67 and connects a circuit formed in the second member 32 and a circuit formed in the first member 31. For example, the wiring 61 passes through one opening formed in the interlayer insulating film 67 and is connected to the input switch circuit 43 via a wiring 315 in the multilayer wiring structure 312. Furthermore, the wiring 61 passes through another opening formed in the interlayer insulating film 67 and is connected to the input matching circuit 54. In addition to the wiring 61, a plurality of other wirings are disposed in the redistribution layer. For example, another wiring in the redistribution layer is used for connection between the transmission control circuit 42 and the bias circuit 53 illustrated in FIG. 1.

The pad 62 is encompassed within the second member 32 in a plan view and is connected to a circuit formed in the second member 32. The other pad 63 is disposed outside the second member 32 in a plan view and is connected to the input switch circuit 43 formed in the first member 31 via a wiring 316 in the multilayer wiring structure 312.

A protection film 68 is disposed on the interlayer insulating film 67 to cover the redistribution layer. Openings are formed in the protection film 68 to make partial regions of upper surfaces of the pads 62 and 63 exposed. Conductive protrusions 82 and 83 are disposed respectively on the pads 62 and 63. The conductive protrusion 82 includes a Cu pillar 82P connected to the pad 62 and a solder layer 82S disposed on an upper surface of the Cu pillar 82P. The conductive protrusion 82 with such a structure is called a Cu pillar bump.

An under bump metal layer may be disposed on a bottom surface of the Cu pillar 82P with intent to improve adhesion of the Cu pillar. The other conductive protrusion 83 also has the same multilayer structure as the conductive protrusion 82. Instead of the Cu pillar bump, for example, an Au bump, a solder ball bump, or a conductive column erected on the pad may also be used as the conductive protrusions 82 and 83 and so on. A bump without including a solder layer, like an Au bump, is also called a pillar. The conductive column erected on the pad is also called a post.

The conductive protrusion 82 is used for connection, for example, between the power supply terminal VCC1 and the power-stage amplifier circuit 51 illustrated in FIG. 1, between the power supply terminal VCC2 and the driver-stage amplifier circuit 52, or between the power-stage amplifier circuit 51 and the output matching circuit 76. The conductive protrusion 82 is further used for connection between a ground conductor in the second member 32 and a ground conductor in or on the module substrate.

The conductive protrusion 83 is used for connection, for example, between the input switch circuit 43 and each of the radio-frequency signal input terminals IN1 and IN2 illustrated in FIG. 1, between the transmission control circuit 42 and each of the power supply terminal VIO1, the control signal terminal SDATA1, and the clock terminal SCLK1, or between the output switch circuit 41 and each of the output matching circuit 76, the duplexers 70, and so on.

The multilayer wiring structure 312 includes one or more layers of metal patterns 313 and a plurality of vias 314. The vias 314 connect between the metal patterns 313 or between the metal film 318 and the metal pattern 313 in a thickness direction. The metal patterns 313 overlap a partial region of the second member 32 in a plan view. The metal pattern 313 disposed in a lowermost wiring layer is connected to the substrate 311 through the vias 314. The metal patterns 313 are not connected electrically to any of the circuits in the first member 31. The metal film 318, the metal patterns 313, and the vias 314 function as a heat transfer path extending from the second member 32 to the substrate 311. The conductive protrusion 82 functions as not only a current path, but also a heat transfer path extending from the second member 32 to the module substrate.

Figure 4A:
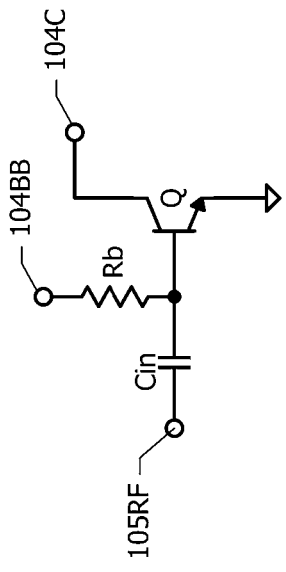
FIG. 4A is an equivalent circuit diagram for each of a plurality of cells forming a power-stage amplifier circuit in the semiconductor device according to the first embodiment.

FIG. 4A is an equivalent circuit diagram for each of a plurality of cells forming the power-stage amplifier circuit 51 (FIG. 1) in the semiconductor device 30 according to the first embodiment. The power-stage amplifier circuit 51 is constituted by the cells connected in parallel to each other. The driver-stage amplifier circuit 52 (FIG. 1) also has a similar circuit configuration to that of the power-stage amplifier circuit 51. However, the number of cells forming the driver-stage amplifier circuit 52 is smaller than the number of cells forming the power-stage amplifier circuit 51.

The cells each include a transistor Q, an input capacitor CM, and a ballast resistance element Rb. A base of the transistor Q is connected to a radio-frequency signal input wiring 105RF through the input capacitor CM. The base of the transistor Q is further connected to a base bias wiring 104BB through the ballast resistance element Rb. An emitter of the transistor Q is grounded. A collector of the transistor Q is connected to a collector wiring 104C. A supply voltage is applied to the collector of the transistor Q via the collector wiring 104C, and an amplified radio-frequency signal is output from the collector.

Figure 4B:
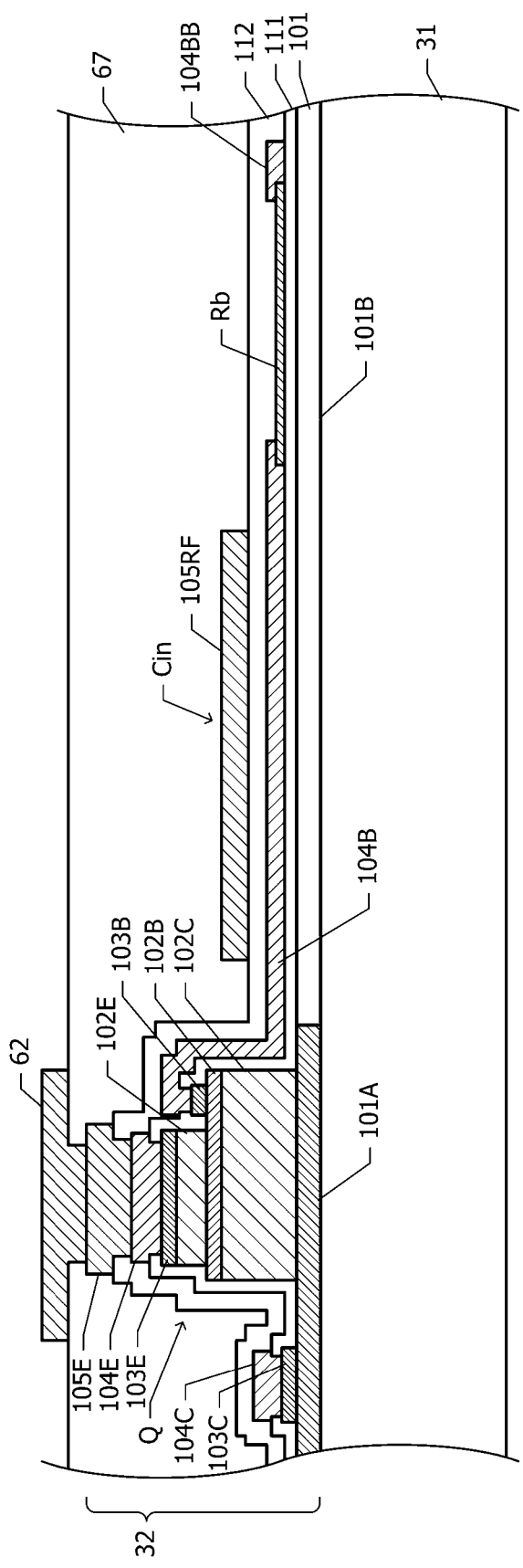
FIG. 4B is a schematic sectional view of one cell of the power-stage amplifier circuit formed in a second member.

FIG. 4B is a schematic sectional view of one cell of the power-stage amplifier circuit 51 (FIG. 1) formed in the second member 32. The second member 32 includes an underlying semiconductor layer 101. The underlying semiconductor layer 101 is in surface contact with the first member 31, whereby the second member 32 is joined to the first member 31. The underlying semiconductor layer 101 is divided into a conductive region 101A and an element isolation region 101B. For example, GaAs is used for the underlying semiconductor layer 101. The conductive region 101A is made of n-type GaAs, and the element isolation region 101B is formed by ion injection of an insulating impurity into an n-type GaAs layer.

The transistor Q is disposed on the conductive region 101A. The transistor Q includes a collector layer 102C, a base layer 102B, and an emitter layer 102E that are laminated in order starting from a side close to the conductive region 101A. The emitter layer 102E is disposed on a partial region of the base layer 102B. In one example, the collector layer 102C is made of n-type GaAs, the base layer 102B is made of p-type GaAs, and the emitter layer 102E is made of n-type InGaP. Thus, the transistor Q is a heterojunction bipolar transistor. A semiconductor element made of another type of compound semiconductor may also be used for the transistor Q.

A base electrode 103B is disposed on the base layer 102B and is electrically connected to the base layer 102B. An emitter electrode 103E is disposed on the emitter layer 102E and is electrically connected to the emitter layer 102E. A collector electrode 103C is disposed on the conductive region 101A. The collector electrode 103C is electrically connected to the collector layer 102C via the conductive region 101A.

An interlayer insulating film 111 as a first insulating layer is disposed on the underlying semiconductor layer 101 to cover the transistor Q, the collector electrode 103C, the base electrode 103B, and the emitter electrode 103E. The interlayer insulating film 111 as the first insulating layer is made of an inorganic insulating material such as SiN, for example. A plurality of openings are formed in the interlayer insulating film 111 at predetermined positions.

An emitter wiring 104E, a base wiring 104B, the collector wiring 104C, and the base bias wiring 104BB each forming a first wiring layer are disposed on the interlayer insulating film 111. The ballast resistance element Rb is further disposed on the interlayer insulating film 111. The emitter wiring 104E passes through one opening formed in the interlayer insulating film 111 and is connected to the emitter electrode 103E. The base wiring 104B passes through another opening formed in the interlayer insulating film 111 and is connected to the base electrode 103B. The collector wiring 104C passes through still another opening formed in the interlayer insulating film 111 and is connected to the collector electrode 103C.

The base wiring 104B extends up to a region where the transistor Q is not disposed, and an extended end of the base wiring 104B overlaps one end portion of the ballast resistance element Rb. In the overlapping region therebetween, the base wiring 104B and the ballast resistance element Rb are electrically connected to each other. The other end portion of the ballast resistance element Rb overlaps the base bias wiring 104BB. In the overlapping region therebetween, the ballast resistance element Rb and the base bias wiring 104BB are electrically connected to each other.

An interlayer insulating film 112 as a second insulating layer is disposed on the interlayer insulating film 111 to cover the emitter wiring 104E, the base wiring 104B, the base bias wiring 104BB, and the ballast resistance element Rb each forming the first wiring layer. The interlayer insulating film 112 as the second insulating layer is also made of an inorganic insulating material such as SiN, for example.

An emitter wiring 105E and a radio-frequency signal input wiring 105RF each forming a second wiring layer are disposed on the interlayer insulating film 112. The emitter wiring 105E in the second wiring layer passes through an opening formed in the interlayer insulating film 112 and is connected to the emitter wiring 104E in the first wiring layer. Part of the radio-frequency signal input wiring 105RF overlaps the base wiring 104B in the first wiring layer in a plan view. In the overlapping region therebetween, the input capacitor Cin is formed.

The interlayer insulating film 67 as a third insulating layer is disposed to cover the emitter wiring 105E and the radio-frequency signal input wiring 105RF in the second wiring layer. The interlayer insulating film 67 as the third insulating layer is made of an organic insulating material such as polyimide, for example. As illustrated in FIG. 3, the interlayer insulating film 67 as the third insulating layer extends to cover the first member 31 as well.

The pad 62 is disposed on the interlayer insulating film 67 as the third insulating layer. The pad 62 passes through an opening formed in the interlayer insulating film 67 and is connected to the emitter wiring 105E in the second wiring layer.

Figure 5A:
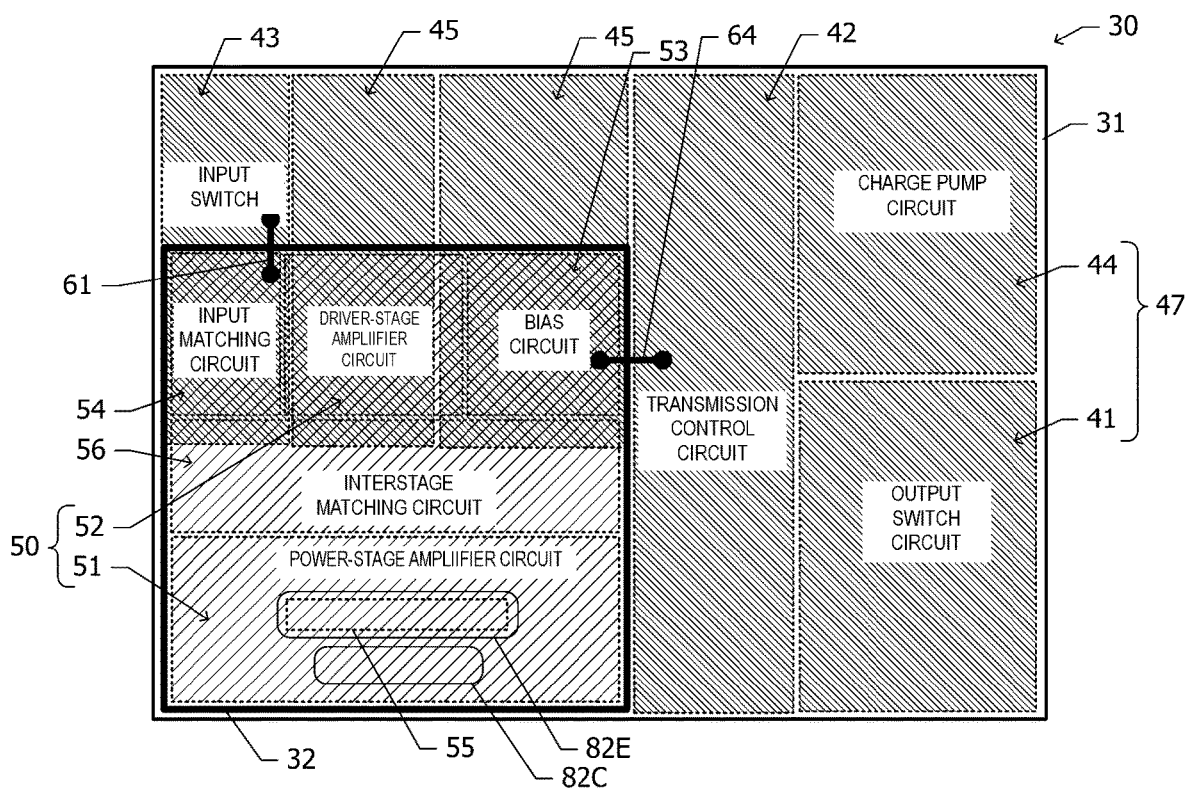
FIG. 5A is a schematic view illustrating a layout of constituent elements of the semiconductor device according to the first embodiment in a plan view.

FIG. 5A is a schematic view illustrating a layout of the constituent elements of the semiconductor device 30 according to the first embodiment in a plan view. In the plan view, the second member 32 is encompassed within the first member 31.

When the first surface 31A (FIG. 3) of the first member 31 is viewed in plan, the input switch circuit 43, the transmission control circuit 42, the output switch circuit 41, a charge pump circuit 44, and other circuits 45 are disposed within the first surface 31A. The other circuits 45 includes, for example, a static electricity protection circuit, a fuse circuit, and a temperature compensation circuit. In FIG. 5A, regions of the first member 31 where the above-mentioned circuits are disposed are denoted by relatively dark hatching with rightward declining lines. Here, the expression "region where a circuit is disposed" implies one region including a plurality of circuit elements, such as an active element and a passive element each forming the circuit, and wirings connecting the circuit elements in a plan view.

The two-stage radio-frequency amplifier circuit 50 made up of the driver-stage amplifier circuit 52 and the power-stage amplifier circuit 51, the bias circuit 53, the input matching circuit 54, and the interstage matching circuit 56 are disposed in the second member 32. In FIG. 5A, regions of the second member 32 where the above-mentioned circuits are disposed are denoted by relatively light hatching with rightward rising lines.

The input switch circuit 43 and the input matching circuit 54 are connected to each other by the wiring 61 (FIG. 3) in the redistribution layer. The transmission control circuit 42 and the bias circuit 53 are connected to each other by another wiring 64 in the redistribution layer.

The charge pump circuit 44 repeats turning-on and -off of a switch in accordance with a periodic clock signal, thereby reversing the polarity of a voltage input to a capacitor and stepping up the input voltage. The output switch circuit 41 is, as illustrated in FIG. 1, a switch turning on and off a radio-frequency signal between one input contact and a plurality of output contacts. The charge pump circuit 44 and the output switch circuit 41 each including the switch repeating the on-off operation as mentioned above are collectively called a switch circuit 47. The charge pump circuit 44 and the output switch circuit 41 are disposed adjacent to each other.

The charge pump circuit 44 and the output switch circuit 41 are disposed apart from the second member 32 in a plan view. The input switch circuit 43 and the other circuits 45 overlap the second member 32 in a plan view.

The transmission control circuit 42 is disposed, in a plan view, in a region between the radio-frequency amplifier circuit 50 formed in the second member 32 and the switch circuit 47 disposed in the first member 31. In other words, at least one circuit element not forming the switch circuit 47 is disposed in the region of the first member 31 between the radio-frequency amplifier circuit 50 and the switch circuit 47. The circuit element not forming the switch circuit 47 includes, for example, an active element, a passive element, and a fuse that are formed in the first member 31.

Figure 5B:
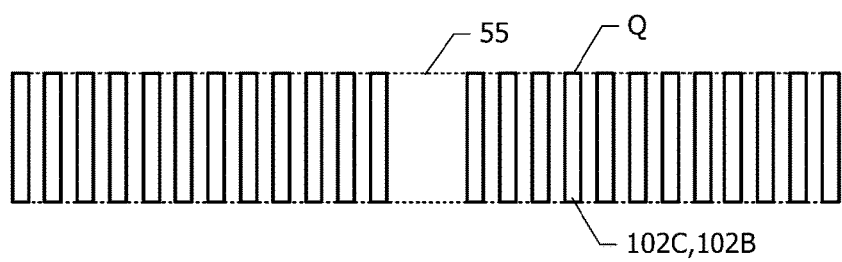
FIG. 5B illustrates a layout of a plurality of transistors forming the power-stage amplifier circuit in a plan view.

FIG. 5B illustrates a layout of the plurality of transistors Q (FIGS. 4A and 4B) forming the power-stage amplifier circuit 51 in a plan view. The transistors Q each include the collector layer 102C and the base layer 102B. An outer peripheral line of the collector layer 102C and an outer peripheral line of the base layer 102B substantially match with each other in a plan view. The emitter layer 102E (FIG. 4B) is encompassed within the base layer 102B in a plan view. The transistors Q each have an elongate shape in one direction (up-down direction in FIG. 5B) in a plan view. Lengthwise directions of the transistors Q are parallel, and the transistors Q are disposed side by side in a direction (right-left direction in FIG. 5B) perpendicular to the lengthwise direction.

The transistors Q are distributed in a region 55. The region 55 where the transistors Q are distributed is defined, for example, as a minimum convex polygon encompassing the transistors Q in a plan view.

Transistor trains each made up of the plurality of transistors Q may be disposed in multiple rows in a direction perpendicular to the direction in which the transistors Q are arrayed. In such a case, a minimum convex polygon encompassing all the transistors Q belonging to the transistor trains may be defined as the region 55 where the transistors Q are distributed.

As illustrated in FIG. 5A, the region 55 where the transistors Q are distributed is positioned within the power-stage amplifier circuit 51. Conductive protrusions 82E and 82C are connected respectively to emitters and collectors of the transistors Q. In a plan view, the conductive protrusion 82E for the emitters encompasses the region 55 where the transistors Q are distributed. The input capacitor CM and the ballast resistance element Rb illustrated in FIGS. 4A and 4B are further disposed in circuit blocks constituting the power-stage amplifier circuit.

A "region between two circuits" will be described below with reference to FIGS. 6A and 6B.

Figure 6A:
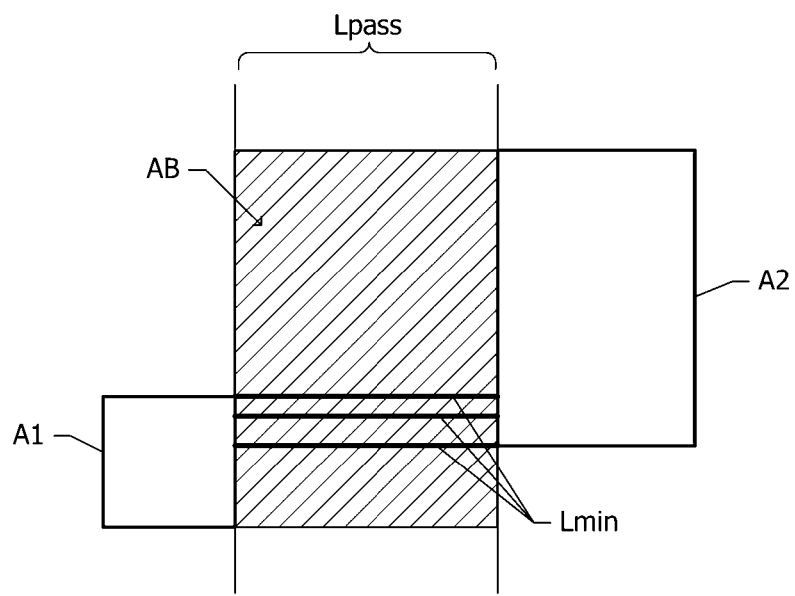
FIGS. 6A and 6B are schematic explanatory views illustrating a region between two circuits.
Figure 6B:
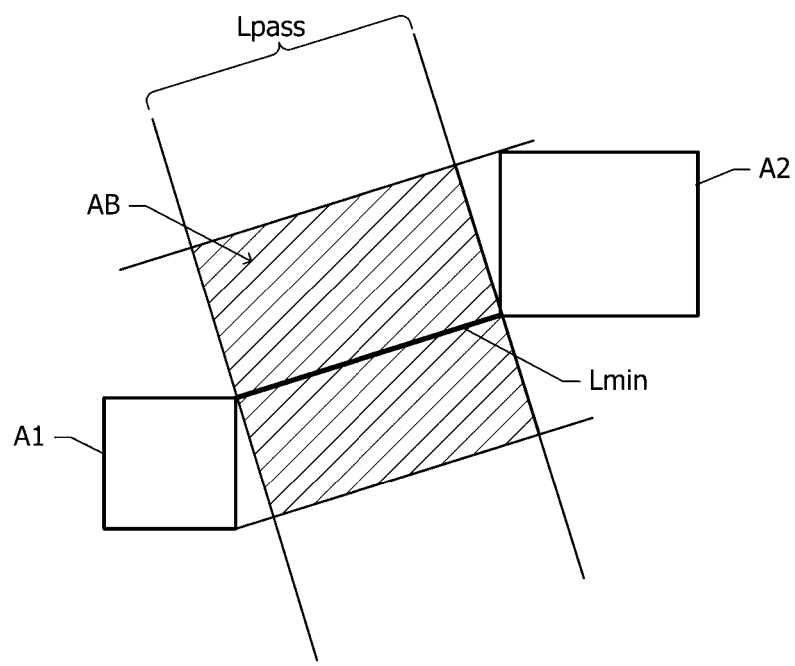

FIGS. 6A and 6B are schematic explanatory views illustrating a region between two circuits. Assuming that a shortest one among line segments connecting a plurality of circuit elements included in a first circuit A1 and a plurality of circuit elements included in a second circuit A2 is denoted by Lmin, and a region over which the line segment Lmin passes when the line segment Lmin is moved in a direction perpendicular to the line segment Lmin is denoted by Lpass. FIG. 6A represents an example in which a plurality of the line segments Lmin exist, and FIG. 6B represents an example in which only one line segment Lmin exists.

A zone of the region Lpass where at least one of the first circuit A1 and the second circuit A2 is present in the direction perpendicular to the line segment Lmin is defined as a region AB between the first circuit A1 and the second circuit A2 (namely, a region denoted by hatching in FIGS. 6A and 6B). When the first circuit A1 and the second circuit A2 are each disposed in a plurality of divided regions, the "region between two circuits" is defined for each of the divided regions.

A method of fabricating the semiconductor device 30 according to the first embodiment will be described below with reference to FIGS. 7A to 8D. FIGS. 7A to 8C are sectional views of the semiconductor device 30 during a manufacturing process, and FIG. 8D is a sectional view of the finished semiconductor device 30.

Figure 7A:
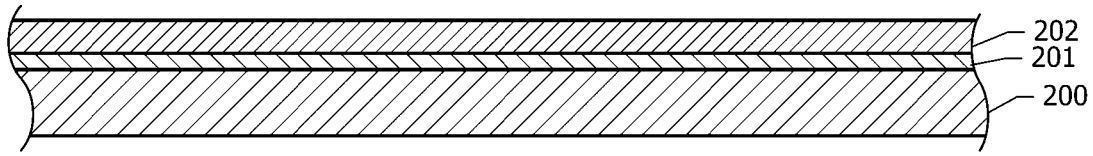
FIGS. 7A to 7F are sectional views of the semiconductor device during a manufacturing process.

As illustrated in FIG. 7A, a release layer 201 is epitaxially grown on a single-crystal base substrate 200 made of a compound semiconductor such as GaAs, and an element formation layer 202 is formed on the release layer 201. The transistors Q, the first wiring layer, the second wiring layer, and so on in the second member 32, illustrated in FIG. 4B, are formed in the element formation layer 202. Those circuit elements and wiring layers are formed in accordance with a general semiconductor process. FIG. 7A does not illustrate element structures formed in the element formation layer 202. In this stage, the element formation layer 202 is not yet separated for each second member 32.

Figure 7B:
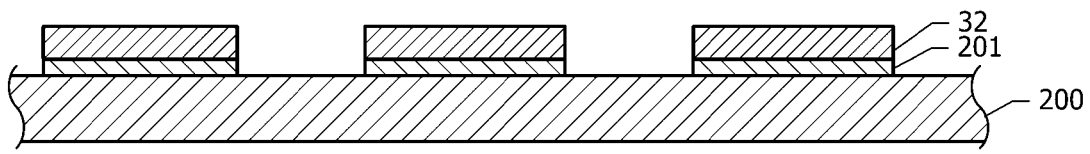

Next, as illustrated in FIG. 7B, the element formation layer 202 (FIG. 5A) and the release layer 201 are subjected to patterning by using a resist pattern (not illustrated) as an etch mask. In this stage, the element formation layer 202 is separated for each second member 32 (FIG. 5A).

Figure 7C:
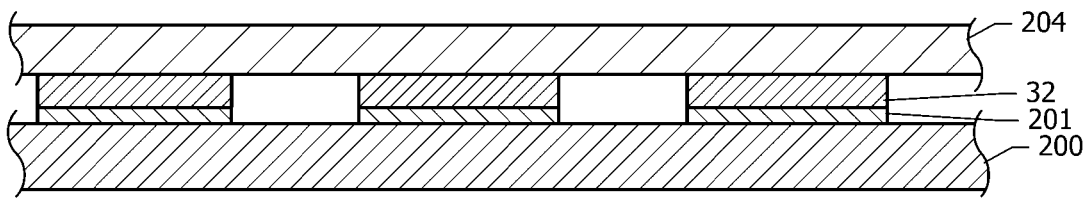

Next, as illustrated in FIG. 7C, a connecting support 204 is bonded on the separated second members 32. As a result, the individual second members 32 are connected to each other by the connecting support 204. The resist pattern used as the etch mask in the patterning step of FIG. 7B may be left such that the resist pattern exists between the second member 32 and the connecting support 204.

Figure 7D:
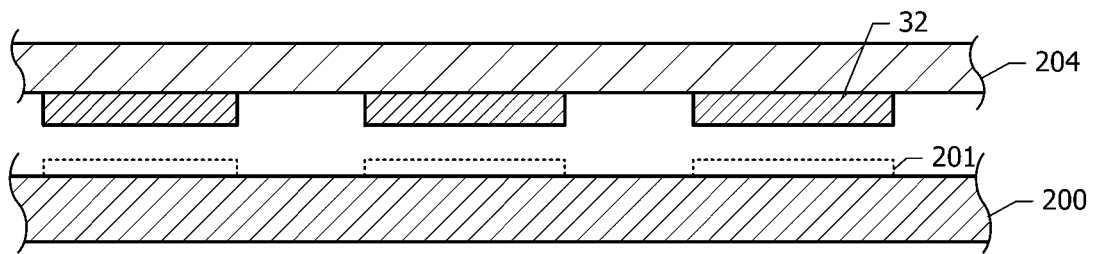

Next, as illustrated in FIG. 7D, the release layer 201 is selectively etched away with respect to the base substrate 200 and the second member 32. As a result, the second member 32 and the connecting support 204 are released from the base substrate 200. To selectively etch the release layer 201, the release layer 201 is formed of a compound semiconductor having an etch resistance different from the etch resistances of both the base substrate 200 and the second member 32.

Figure 7E:
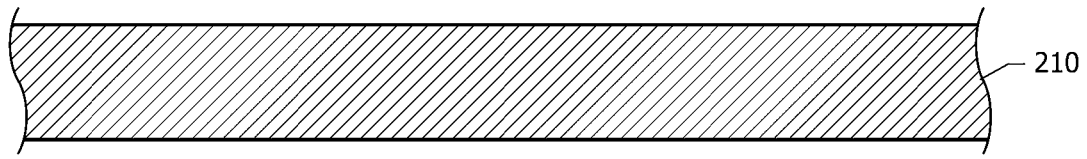

As illustrated in FIG. 7E, a substrate 210 is prepared which includes the input switch circuit 43, the multilayer wiring structure 312 (FIG. 3), and so on that are to be disposed in the first member 31 (FIG. 3). In this stage, the substrate 210 is not yet separated for each first member 31.

Figure 7F:
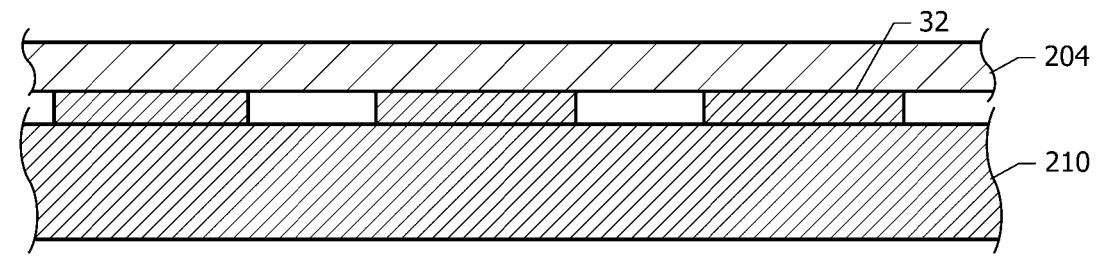

As illustrated in FIG. 7F, the second member 32 is joined to the substrate 210. Van der Waals bonding or hydrogen bonding is utilized to join the second member 32 and the substrate 210. Alternatively, the second member 32 may be joined to the substrate 210 by, for example, electrostatic force, covalent bonding, or eutectic alloy bonding. For example, when part of a surface of the substrate 210 is made of Au, the second member 32 and the substrate 210 may be joined to each other by bringing the second member 32 into close contact with an Au region and then applying pressure.

Figure 8A:
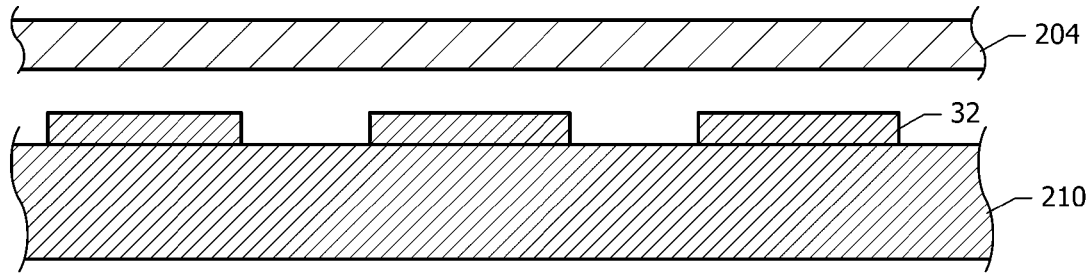
FIGS. 8A to 8C are sectional views of the semiconductor device during the manufacturing process.
Figure 8B:
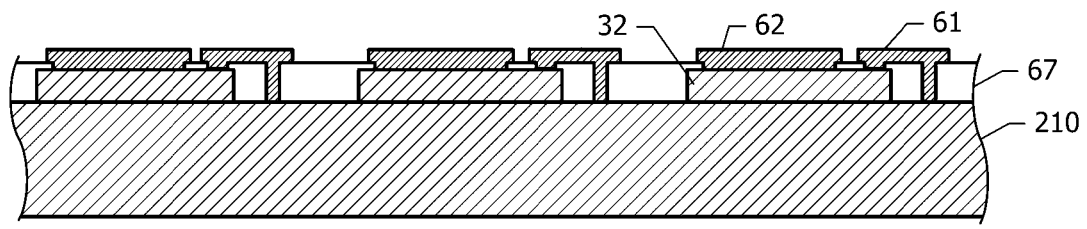

Next, as illustrated in FIG. 8A, the connecting support 204 is released from the second member 32. After releasing the connecting support 204, as illustrated in FIG. 8B, the interlayer insulating film 67 and the redistribution layer are formed over the substrate 210 and the second member 32. The redistribution layer includes, for example, the wiring 61 and the pads 62 and 63 (FIG. 3).

Figure 8C:
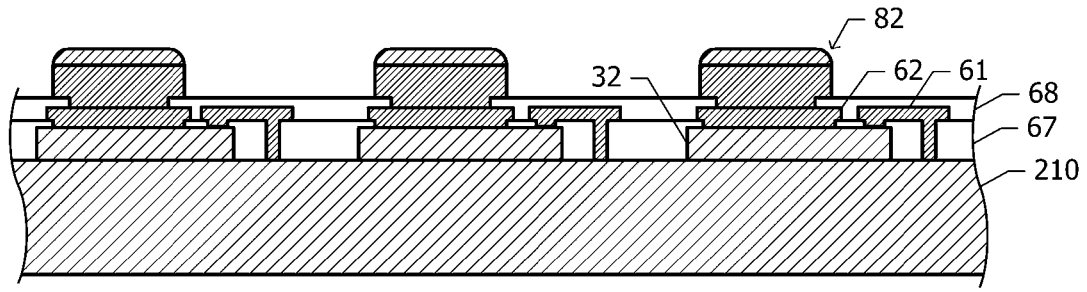
Figure 8D:
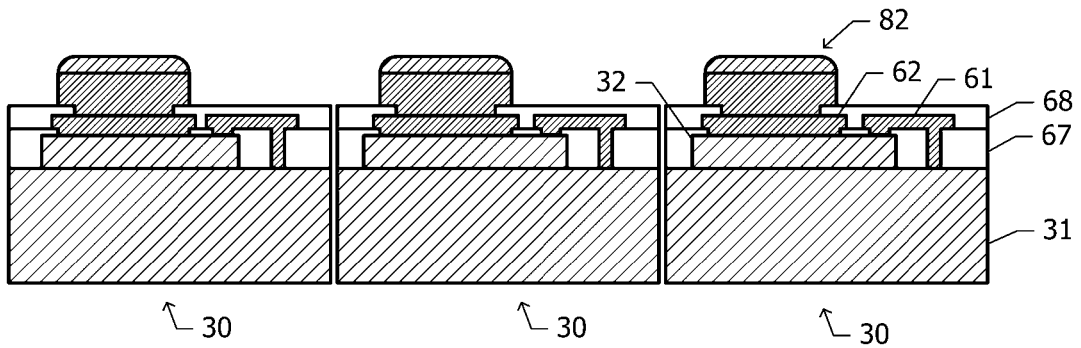
FIG. 8D is a sectional view of the finished semiconductor device.

Next, as illustrated in FIG. 8C, the protection film 68 is formed on the redistribution layer, and openings are formed in the protection film 68 at predetermined positions. Thereafter, the conductive protrusion 82 is formed in each of the openings and on the protection film 68. At the same time as forming the conductive protrusion 82, the other conductive protrusion 83 (FIG. 3) and so on are also formed.

Finally, as illustrated in FIG. 8D, the substrate 210 is cut with a dicing machine. As a result, the individual semiconductor devices 30 are obtained.

Advantageous effects of the first embodiment will be described below.

In the first embodiment, as illustrated in FIG. 3, the heat transfer path extending from the second member 32 to the first member 31 is formed. Since the second member 32 is in surface-contact with the first member 31, the second member 32 and the first member 31 are thermally coupled to each other with low thermal resistance. Furthermore, since the metal patterns 313 and the vias 314 are formed in the multilayer wiring structure 312 right under the second member 32, the thermal resistance of the transfer path from the second member 32 to the substrate 311 is lower than that when an entire region of the multilayer wiring structure 312 right under the second member 32 is made of an insulating material. Since the metal patterns 313 are not connected electrically to any of the circuit blocks in the first member 31, the metal patterns 313 functioning as the heat transfer path do not affect operations of the circuit blocks in the first member 31. The metal patterns 313 may be electrically connected to the ground conductor in the first member 31.

The heat transferred from the second member 32 to the first member 31 diffuses in the first member 31. The heat having diffused in the first member 31 is radiated to the outside from surfaces of the first member 31. When the semiconductor device 30 is covered with molding resin in a state of being mounted on the module substrate, the heat is transferred from the first member 31 to the molding resin.

Furthermore, the conductive protrusion 82 functions as the heat transfer path from the second member 32 to the module substrate. Thus, the heat is dissipated through two heat transfer paths, namely the heat transfer path extending from the second member 32 to the module substrate and the heat transfer path extending from the second member 32 to the first member 31. Therefore, the characteristics of heat dissipation from the second member 32 can be improved. To obtain a sufficient effect of improving the characteristics of heat dissipation, a semiconductor portion of the substrate 311 of the first member 31 is preferably made of a semiconductor, for example, an elemental semiconductor such as Si or Ge, with higher thermal conductivity than the compound semiconductor forming the semiconductor elements that are formed in the second member 32. Moreover, from the viewpoint of amplifying the radio-frequency signal, semiconductor elements made of a compound semiconductor with higher electron mobility than the semiconductor portion of the substrate 311 of the first member 31 are preferably used as the semiconductor elements formed in the second member 32.

Heat is more likely to generate in the region 55 (FIG. 5A) of the second member 32 where the transistors Q forming the power-stage amplifier circuit 51 are distributed. To reduce the thermal resistance of the heat transfer path from the region 55 where the transistors Q are distributed to the substrate 311 (FIG. 3) of the first member 31, the metal patterns 313 (FIG. 3) are preferably disposed such that the region 55 where the transistors Q are distributed is encompassed within the contour of the metal patterns 313 in a plan view. Furthermore, the metal film 318 (FIG. 3) is preferably disposed such that the region 55 where the transistors Q are distributed is encompassed within the contour of the metal film 318 in a plan view.

Moreover, according to the first embodiment, the second member 32 (FIG. 5A) overlaps the input switch circuit 43 and the other circuits 45 in the first member 31. Therefore, the size of the semiconductor device 30 in a plan view can be reduced in comparison with the case in which the second member 32 does not overlap any of the circuits in the first member 31.

In addition, according to the first embodiment, since the switch circuit 47 is disposed apart from the radio-frequency amplifier circuit 50 in an in-plane direction, isolation between the radio-frequency amplifier circuit 50 and the switch circuit 47 can be increased. For example, spurious generated from each of the output switch circuit 41 and the charge pump circuit 44 can be suppressed from mixing into a radio-frequency signal that is to be amplified or that has been amplified by the radio-frequency amplifier circuit 50. Furthermore, harmonics of the radio-frequency signal having been amplified by the power-stage amplifier circuit 51 can be suppressed from directly coupling to the output switch circuit 41 without being subjected to filtering in the output matching circuit 76 (FIG. 1).

Although the input switch circuit 43 and the driver-stage amplifier circuit 52 are disposed close to each other, the problem caused in the case of disposing the switch circuit 47 and the radio-frequency amplifier circuit 50 close to each other is hard to occur for the following reason. Impedance matching on an input side of the driver-stage amplifier circuit 52 is realized with cooperation of the input switch circuit 43 and the input matching circuit 54. Therefore, high isolation is not required between the input switch circuit 43 and the driver-stage amplifier circuit 52. Moreover, the level of a signal passing through the input switch circuit 43 is sufficiently lower than that of a signal passing through the output switch circuit 41. In the input switch circuit 43, therefore, a negative voltage generated from the charge pump circuit 44 is not used in some cases. In such a case, the necessity of increasing isolation with respect to the other circuits is lower for the input switch circuit 43 than for the output switch circuit 41.

While the radio-frequency amplifier circuit 50 and the switch circuit 47 are disposed apart from each other, the transmission control circuit 42 is disposed between both the circuits. Accordingly, an increase in the size of the semiconductor device 30 is not resulted even when the radio-frequency amplifier circuit 50 and the switch circuit 47 are disposed apart from each other.

In the first embodiment, the charge pump circuit 44 and the output switch circuit 41 are disposed adjacent to each other. The output switch circuit 41 is operated with the negative voltage generated from the charge pump circuit 44. Since the charge pump circuit 44 generating the negative voltage to operate the output switch circuit 41 is disposed adjacent to the output switch circuit, malfunction of the switch can be suppressed. In addition, since the length of a wiring connecting the charge pump circuit 44 and the output switch circuit 41 is shortened, spurious is suppressed from mixing into the output switch circuit 41 from surrounding circuits via the wiring.

A modification of the first embodiment will be described below.

Although, in the first embodiment (FIG. 3), the heat transfer path formed by the metal film 318, the metal patterns 313, and the vias 314 (FIG. 3) in the first member 31, the latter two being present in the multilayer wiring structure 312, is in contact with the second member 32 and the substrate 311, the heat transfer path formed by the metal film 318, the metal patterns 313, and the vias 314 is not always needed to be in contact with the second member 32 and the substrate 311. For example, a heat transfer path formed by the metal patterns 313 and the vias 314 may be thermally coupled to each of the second member 32 and the substrate 311 with an insulating film interposed therebetween. In such a case, the insulating film functions as part of the heat transfer path from the second member 32 to the substrate 311. In another example, without forming the metal film 318, the first-member protection film 317 may be formed over the entirety of the first surface 31A. In such a case, a portion of the first-member protection film 317, the portion being in contact with the second member 32, mainly functions as the heat transfer path.

When the metal patterns 313 and the vias 314 are not disposed, the thermal resistance of the heat transfer path from the second member 32 to the substrate 311 increases. However, when a sufficient output of the power-stage amplifier circuit 51 is ensured, the metal patterns 313 and the vias 314 does not always need to be disposed. In such a case, the insulating films included in the multilayer wiring structure 312 function as the heat transfer path.

Although, in the first embodiment (FIG. 5A), the transmission control circuit 42 is disposed between the radio-frequency amplifier circuit 50 and the switch circuit 47, circuit elements of another circuit not forming the switch circuit 47 may be disposed between both the circuits 50 and 47. The circuit to be disposed between the radio-frequency amplifier circuit 50 and the switch circuit 47 is preferably a circuit that is hard to generate spurious than the charge pump circuit 44 and the output switch circuit 41. As an alternative, a circuit not operating during the operation of the radio-frequency amplifier circuit 50 is preferably disposed between the radio-frequency amplifier circuit 50 and the switch circuit 47. Such a circuit is, for example, the static electricity protection circuit, the temperature compensation circuit, and the fuse circuit.

Although, in the first embodiment, the semiconductor device 30 is mounted on the radio-frequency module 20 (FIG. 1) adapted for the frequency division duplex (FDD) system, the semiconductor device 30 may be mounted on a radio-frequency module adapted for a time division duplex (TDD) system.

When the semiconductor device 30 is mounted on the radio-frequency module adapted for the TDD system, a transmit-receive switch is used as the output switch circuit 41 (FIG. 1). The transmit-receive switch includes two contacts and one common terminal. One of the two contacts is connected to the power-stage amplifier circuit 51 through the output matching circuit 76 (FIG. 1). The other contact is connected to the low-noise amplifier 71 (FIG. 1) for amplifying the received signal or to the low-noise amplifier 71 through the band selection switch 73 (FIG. 1) for reception. The common terminal is connected to the antenna terminal through a filter. When the transmit-receive switch is used as the output switch circuit 41, the transmission control circuit 42 is also disposed between the output switch circuit 41 (FIG. 5A) and the radio-frequency amplifier circuit 50 as in the first embodiment.

Second Embodiment

A semiconductor device according to a second embodiment will be described below with reference to FIGS. 9 and 10. In the following, description of a configuration common to that of the semiconductor device according to the first embodiment described above with reference to FIGS. 1 to 8D is omitted.

Figure 9:
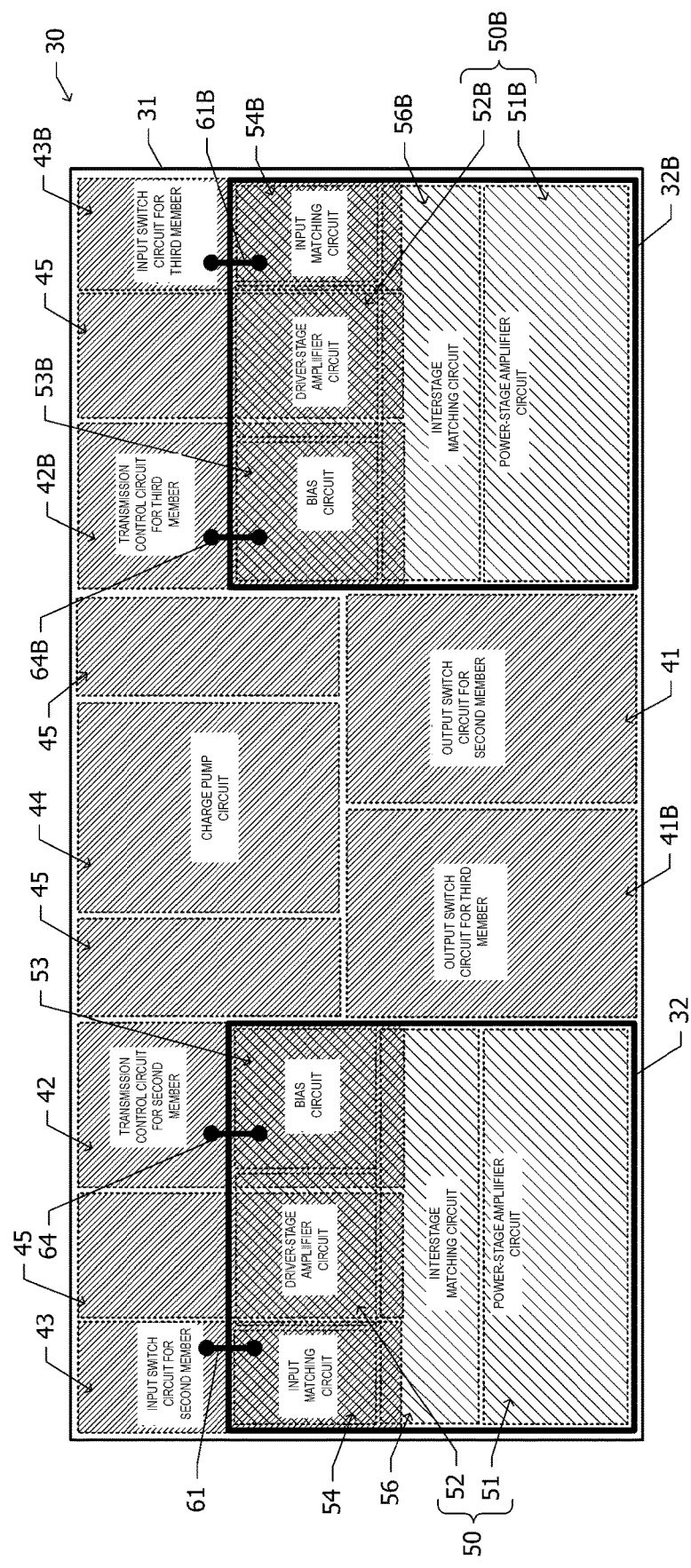
FIG. 9 is a schematic view illustrating a layout of constituent elements of a semiconductor device according to a second embodiment in a plan view.

FIG. 9 is a schematic view illustrating a layout of constituent elements of the semiconductor device 30 according to the second embodiment in a plan view. In FIG. 9, as in FIG. 5A, regions of a first member 31 where circuits are disposed are denoted by relatively dark hatching with rightward declining lines, and regions of a second member 32 where circuits are disposed are denoted by relatively light hatching with rightward rising lines.

Although, in the semiconductor device 30 (FIG. 5A) according to the first embodiment, only one second member 32 is joined to the first member 31, a third member 32B is further joined to the first member 31 in addition to the second member 32 in the semiconductor device 30 according to the second embodiment. The second member 32 in the second embodiment has the same configuration as the second member 32 in the semiconductor device 30 according to the first embodiment. The third member 32B includes, like the second member 32, a two-stage radio-frequency amplifier circuit 50B made up of a power-stage amplifier circuit 51B and a driver-stage amplifier circuit 52B, a bias circuit 53B, an input matching circuit MB, and an interstage matching circuit 56B.

In the first member 31, an input switch circuit 43, a transmission control circuit 42, and an output switch circuit 41 for the second member 32 are disposed as in the first member 31 in the semiconductor device 30 according to the first embodiment. An input switch circuit 43B, a transmission control circuit 42B, and an output switch circuit 41B for the third member 32B are further disposed in the first member 31. Moreover, a charge pump circuit 44 shared by both the second member 32 and the third member 32B is disposed in the first member 31. In addition, as in the first embodiment, other circuits 45 are disposed in the first member 31.

In a plan view, the output switch circuit 41B for the third member 32B is disposed between the radio-frequency amplifier circuit 50 in the second member 32 and the output switch circuit 41 for the second member 32. The output switch circuit 41 for the second member 32 is disposed between the radio-frequency amplifier circuit 50B in the third member 32B and the output switch circuit 41B for the third member 32B.

One of the other circuits 45 and the output switch circuit 41B for the third member 32B are disposed between the charge pump circuit 44 and the radio-frequency amplifier circuit 50 for the second member 32. Another one of the other circuits 45 and the output switch circuit 41 for the second member 32 are disposed between the charge pump circuit 44 and the radio-frequency amplifier circuit 50B for the third member 32B.

In other words, the radio-frequency amplifier circuit 50 in the second member 32 and the output switch circuit 41 for the second member 32 are disposed apart from each other. Similarly, the radio-frequency amplifier circuit 50B in the third member 32B and the output switch circuit 41B for the third member 32B are also disposed apart from each other.

The input matching circuit 54B in the third member 32B and the input switch circuit 43B for the third member 32B are connected to each other by a wiring 61B in the redistribution layer. The bias circuit 53B in the third member 32B and the transmission control circuit 42B for the third member 32B are connected to each other by a wiring 64B in the redistribution layer.

The radio-frequency amplifier circuit 50 in the second member 32 and the radio-frequency amplifier circuit 50B in the third member 32B operate in frequency bands different from each other. One radio-frequency amplifier circuit 50 and the other radio-frequency amplifier circuit 50B are operated selectively and are not operated at the same time.

Figure 10:
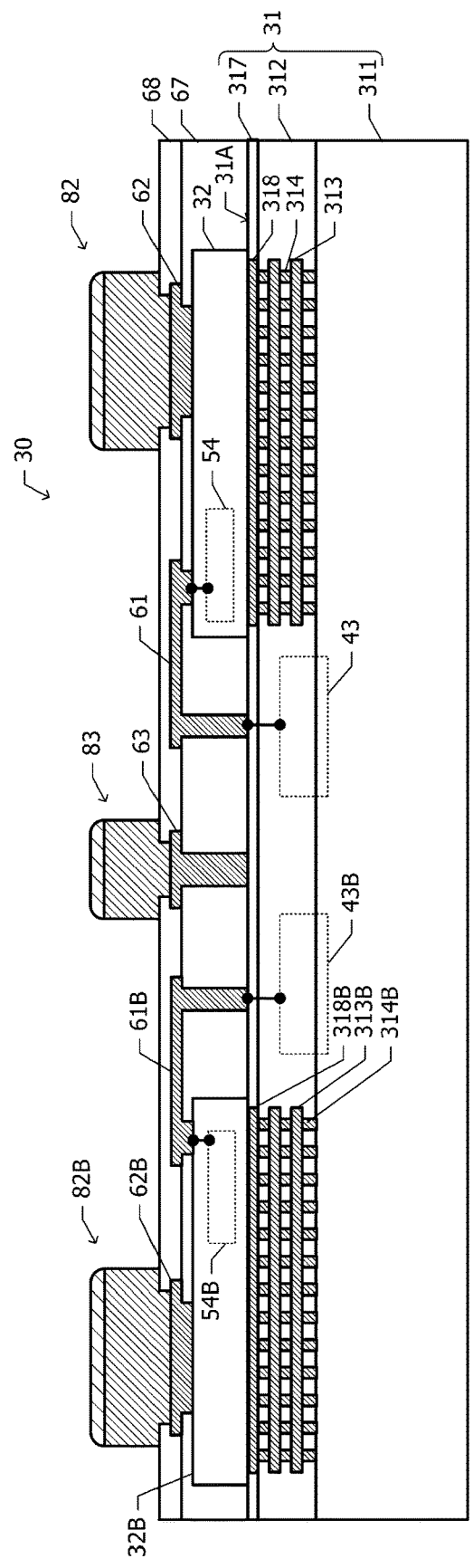
FIG. 10 is a schematic sectional view of the semiconductor device according to the second embodiment.

FIG. 10 is a schematic sectional view of the semiconductor device 30 according to the second embodiment. In addition to the second member 32, the third member 32B is further joined to a first surface 31A of the first member 31 in surface contact with the first surface 31A. As in the second member 32, a pad 62B, a conductive protrusion 82B, a wiring 61B, a metal film 318B, one or more layers of metal patterns 313B, and a plurality of vias 314B are disposed in the third member 32B. The conductive protrusion 82B protrudes from the third member 32B. The metal film 318B, the metal patterns 313B, and the vias 314B, the latter two being present in a multilayer wiring structure 312, overlap the third member 32B in a plan view. The wiring 61B in the redistribution layer connects the input matching circuit 54B in the third member 32B and the input switch circuit 43B for the third member 32B, the input switch circuit 43B being present in the first member 31.

Advantageous effects of the second embodiment will be described below.

In the second embodiment, as in the first embodiment, since the radio-frequency amplifier circuit 50 in the second member 32 and the output switch circuit 41 for the second member 32 are disposed apart from each other, isolation between both the circuits 50 and 41 can be increased. Similarly, isolation between the radio-frequency amplifier circuit 50B in the third member 32B and the output switch circuit 41B for the third member 32B can be increased.

In the second embodiment, the output switch circuit 41B for the third member 32B is disposed close to the radio-frequency amplifier circuit 50 in the second member 32, and the output switch circuit 41 for the second member 32 is disposed close to the radio-frequency amplifier circuit 50B in the third member 32B. However, the radio-frequency amplifier circuit 50 and the radio-frequency amplifier circuit 50B are not operated at the same time. Therefore, even when electromagnetic coupling occurs between the radio-frequency amplifier circuit 50 and the output switch circuit 41B disposed close to each other and between the radio-frequency amplifier circuit 50B and the output switch circuit 41 disposed close to each other, the operations of the radio-frequency amplifier circuit 50 and the radio-frequency amplifier circuit 50B are substantially not affected by the above-mentioned electromagnetic coupling.

Furthermore, since the third member 32B is in surface contact with the first member 31 and the conductive protrusion 82B is disposed for the third member 32B, the characteristics of heat dissipation from the third member 32B can be improved.

Third Embodiment

A semiconductor device according to a third embodiment will be described below with reference to FIG. 11. In the following, description of a configuration common to that of the semiconductor device according to the second embodiment described above with reference to FIGS. 9 and 10 is omitted.

Figure 11:
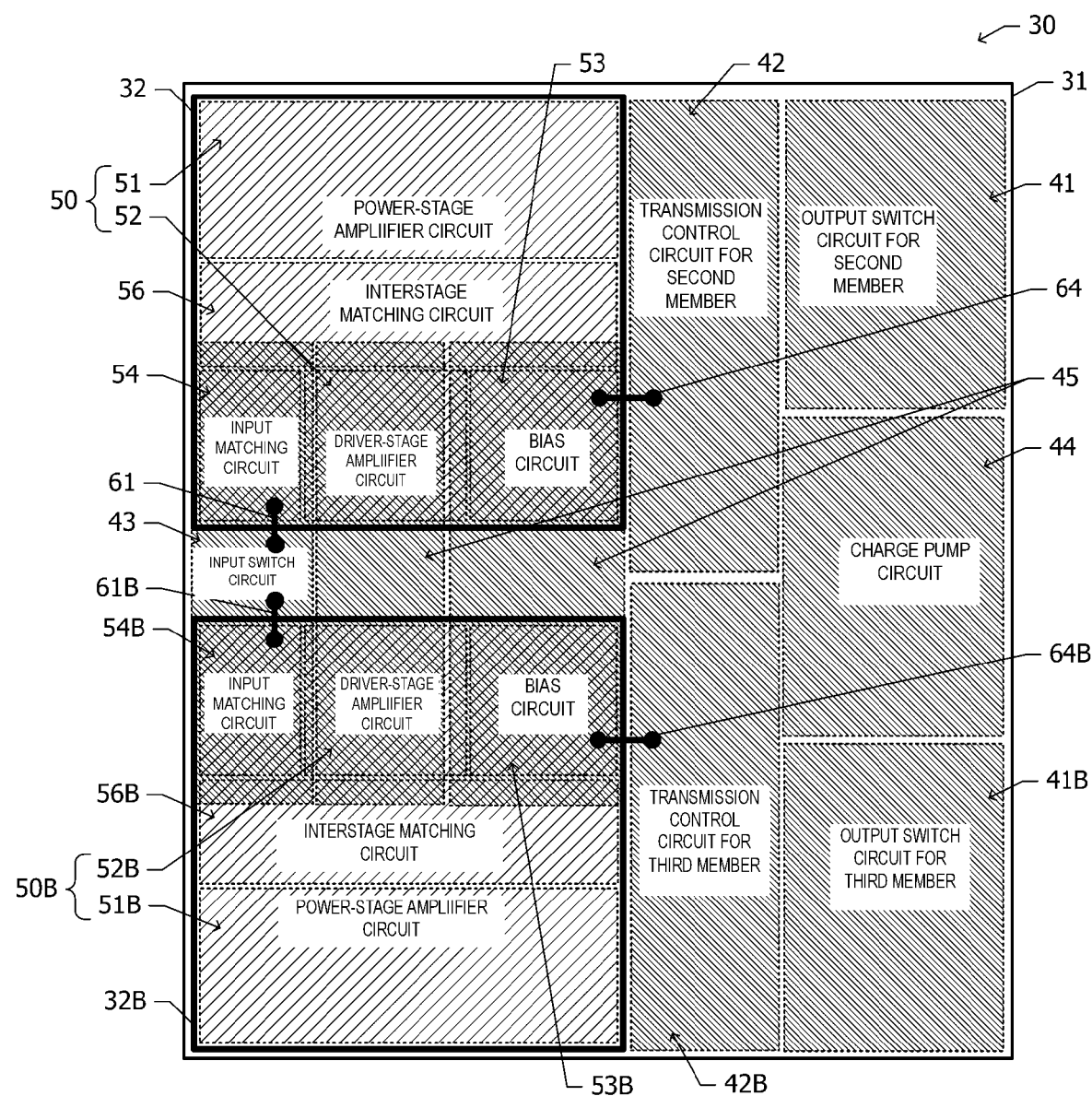
FIG. 11 is a schematic view illustrating a layout of constituent elements of a semiconductor device according to a third embodiment in a plan view.

FIG. 11 is a schematic view illustrating a layout of constituent elements of the semiconductor device 30 according to the third embodiment in a plan view. In FIG. 11, as in FIG. 9, regions of a first member 31 where circuits are disposed are denoted by relatively dark hatching with rightward declining lines, and regions of a second member 32 where circuits are disposed are denoted by relatively light hatching with rightward rising lines.

In the third embodiment, as in the second embodiment, the second member 32 and the third member 32B are joined to the first member 31 in surface contact with the first member 31. The second member 32 and the third member 32B also have the same configurations as the second member 32 and the third member 32B in the semiconductor device 30 (FIGS. 9 and 10) according to the second embodiment.

The transmission control circuit 42 and the output switch circuit 41 both for the second member 32 and the transmission control circuit 42B and the output switch circuit 41B both for the third member 32B are disposed in the first member 31. The input switch circuit 43 disposed in the first member 31 is shared by the second member 32 and the third member 32B.

As in the second embodiment, the wirings 61 and 64 in the redistribution layer connect the circuits in the second member 32 and the circuits in the first member 31, while the wirings 61B and 64B connect the circuits in the third member 32B and the circuits in the first member 31.

In the third embodiment, the transmission control circuit 42 for the second member 32 is disposed between the radio-frequency amplifier circuit 50 in the second member 32 and the output switch circuit 41 for the second member 32. This positional relation is similar to the positional relation in the semiconductor device 30 (FIG. 5A) according to the first embodiment. Furthermore, the transmission control circuit 42B for the third member 32B is disposed between the radio-frequency amplifier circuit 50B in the third member 32B and the output switch circuit 41B for the third member 32B.

The transmission control circuit 42 for the second member 32 and the transmission control circuit 42B for the third member 32B are disposed between the charge pump circuit 44 and the radio-frequency amplifier circuit 50 in the second member 32. The transmission control circuit 42 for the second member 32 and the transmission control circuit 42B for the third member 32B are similarly disposed between the charge pump circuit 44 and the radio-frequency amplifier circuit 50B in the third member 32B.

Moreover, the transmission control circuit 42 for the second member 32 and the transmission control circuit 42B for the third member 32B are disposed respectively between the radio-frequency amplifier circuit 50 in the second member 32 and the output switch circuit 41B for the third member 32B and between the radio-frequency amplifier circuit 50B in the third member 32B and the output switch circuit 41 for the second member 32.

Advantageous effects of the third embodiment will be described below.

In the third embodiment, as in the second embodiment, since the radio-frequency amplifier circuit 50 in the second member 32 and the output switch circuit 41 for the second member 32 are disposed apart from each other, isolation between both the circuits 50 and 41 can be increased. Similarly, isolation between the radio-frequency amplifier circuit 50B in the third member 32B and the output switch circuit 41B for the third member 32B can be increased.

In the second embodiment (FIG. 9), the radio-frequency amplifier circuit 50 in the second member 32 and the output switch circuit 41B for the third member 32B are disposed close to each other. By contrast, in the third embodiment, the radio-frequency amplifier circuit 50 in the second member 32 and the output switch circuit 41B for the third member 32B are disposed apart from each other. Therefore, isolation between the radio-frequency amplifier circuit 50 and the output switch circuit 41B can be increased. Similarly, isolation between the radio-frequency amplifier circuit 50B and the output switch circuit 41 can be increased. This provides an advantageous effect that, even when the radio-frequency amplifier circuit 50 in the second member 32 and the radio-frequency amplifier circuit 50B in the third member 32B are operated at the same time, electromagnetic interference is hard to occur between the radio-frequency amplifier circuits and the output switch circuits.

A modification of the third embodiment will be described below with reference to FIG. 12.

Figure 12:
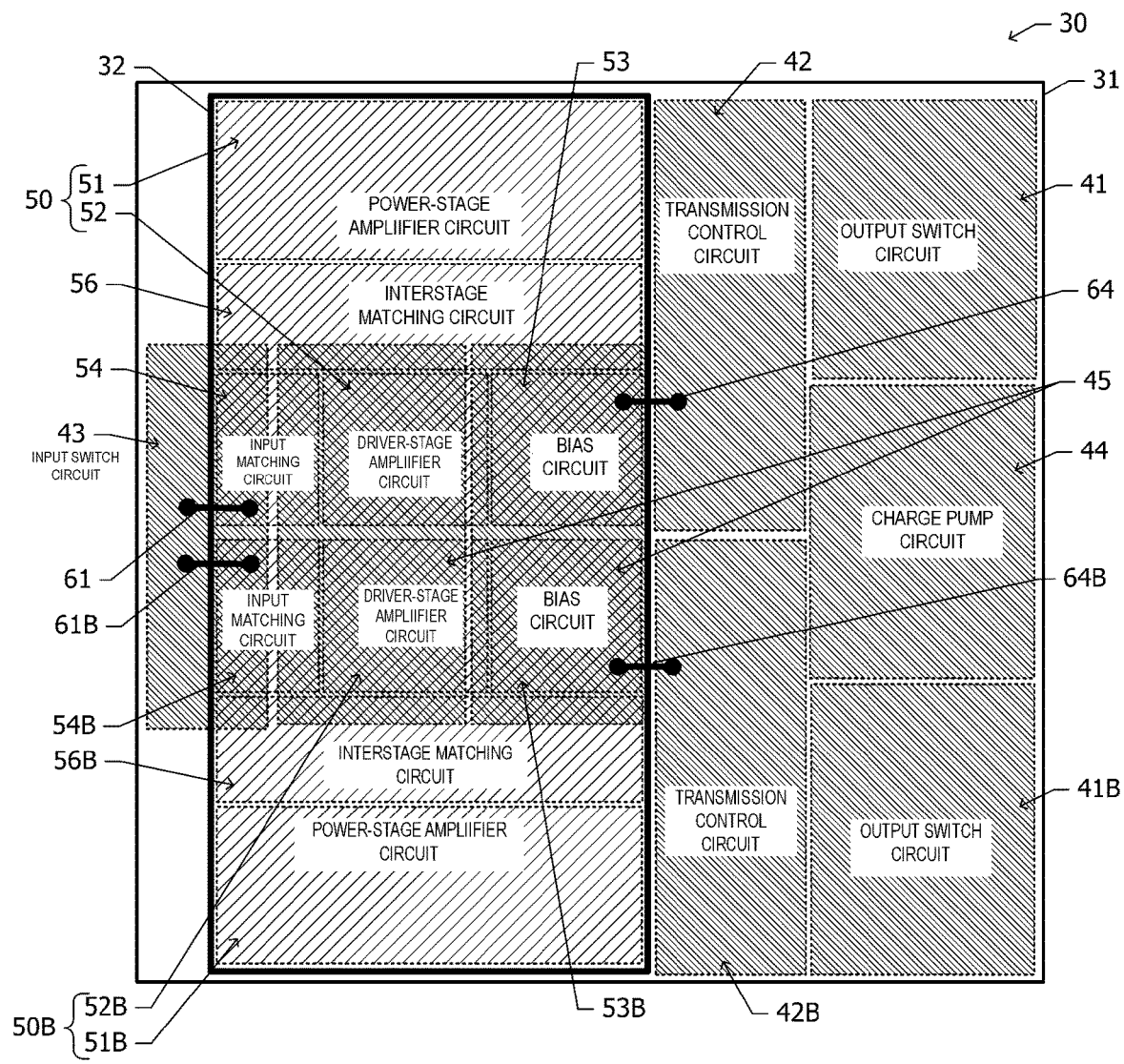
FIG. 12 is a schematic view illustrating a layout of constituent elements of a semiconductor device according to a modification of the third embodiment in a plan view.

FIG. 12 is a schematic view illustrating a layout of constituent elements of the semiconductor device 30 according to the modification of the third embodiment in a plan view. In FIG. 12, as in FIG. 11, regions of the first member 31 where circuits are disposed are denoted by relatively dark hatching with rightward declining lines, and regions of the second member 32 where circuits are disposed are denoted by relatively light hatching with rightward rising lines.

In the third embodiment, the second member 32 and the third member 32B are joined to the first member 31, and the driver-stage amplifier circuits 52 and 52B, the power-stage amplifier circuits 51 and 51B, and so on are formed respectively in the second member 32 and the third member 32B. By contrast, in this modification, only one second member 32 is joined to the first member 31, and two driver-stage amplifier circuits 52 and 52B, two power-stage amplifier circuits 51 and 51B, two input matching circuits 54 and 54B, and two bias circuits 53 and 53B are formed in the one second member 32.

At least part of the input switch circuit 43 formed in the first member 31 is disposed outside the second member 32 in a plan view. The wirings 61 and 61B in the redistribution layer are connected to the input switch circuit 43 outside the second member 32 in a plan view. As in this modification, two systems of amplifier circuits may be formed in one second member 32.

The above-described embodiments are merely illustrative and, as a matter of course, partial replacement and combination of the features described in the different embodiments can be implemented. Similar operations and advantageous effects with similar features in the different embodiments are not described for each of the embodiments. Furthermore, the present disclosure is not limited to the above-described embodiments. It is apparent to those skilled in the art that, for example, various variations, modifications, combinations, and so on also conceivable.

What is claimed is:

1. A semiconductor device comprising:
    a first member having a first surface and including at least one switch circuit that includes a switch and is disposed within the first surface when the first surface is viewed in plan;
    a second member joined to the first surface of the first member in surface contact with the first surface, the second member including a plurality of transistors that are made of a compound semiconductor and configure a radio-frequency amplifier circuit; and
    a first conductive protrusion protruding from the second member on an opposite side to the first member,
    wherein the first member includes a circuit element disposed between the radio-frequency amplifier circuit and the at least one switch circuit in a plan view, such that the circuit element is not part of the at least one switch circuit.

2. The semiconductor device according to claim 1, wherein
    the at least one switch circuit includes:
    a charge pump circuit; and
    an output switch circuit configured to allocate a radio-frequency signal output from the radio-frequency amplifier circuit to one output contact selected from a plurality of output contacts,
    the charge pump circuit and the output switch circuit being disposed adjacent to each other.

3. The semiconductor device according to claim 2, further comprising:
    a third member joined to the first member in surface contact with the first surface, the third member including a plurality of other transistors that are made of a compound semiconductor and configure another radio-frequency amplifier circuit; and
    a second conductive protrusion protruding from the third member on an opposite side to the first member,
    wherein the first member further includes an output switch circuit for the third member, the output switch circuit being configured to allocate a radio-frequency signal output from the radio-frequency amplifier circuit in the third member to one output contact selected from a plurality of output contacts, and
    in a plan view, the output switch circuit for the third member is disposed between the radio-frequency amplifier circuit in the second member and the output switch circuit for the second member, and the output switch circuit for the second member is disposed between the radio-frequency amplifier circuit in the third member and the output switch circuit for the third member.

4. The semiconductor device according to claim 3, wherein
    the radio-frequency amplifier circuit in the second member and the radio-frequency amplifier circuit in the third member are configured to operate in different frequency bands.

* * * * *